United States Patent
Uemura et al.

(10) Patent No.: US 8,450,836 B2
(45) Date of Patent: May 28, 2013

(54) SEMICONDUCTOR DEVICE

(75) Inventors: Shinichiro Uemura, Osaka (JP); Yukio Hiraoka, Hyogo (JP); Takayuki Kai, Kyoto (JP)

(73) Assignee: Panasonic Corporation, Osaka (JP)

( * ) Notice: Subject to any disclaimer, the term of this patent is extended or adjusted under 35 U.S.C. 154(b) by 203 days.

(21) Appl. No.: 13/181,073

(22) Filed: Jul. 12, 2011

(65) Prior Publication Data
US 2011/0266646 A1 Nov. 3, 2011

Related U.S. Application Data

(63) Continuation of application No. PCT/JP2010/004909, filed on Aug. 4, 2010.

(30) Foreign Application Priority Data

Jan. 15, 2010 (JP) .................................. 2010-006503

(51) Int. Cl.
H01L 23/552 (2006.01)
H01L 21/00 (2006.01)

(52) U.S. Cl.
USPC .................. 257/659; 257/660; 257/E23.145; 438/129

(58) Field of Classification Search
USPC ................... 438/129; 257/659, 660, E23.145
See application file for complete search history.

(56) References Cited

U.S. PATENT DOCUMENTS

| | | | |
|---|---|---|---|
| 5,231,308 A * | 7/1993 | Fisch | 307/10.1 |
| 5,889,314 A | 3/1999 | Hirabayashi | |
| 5,994,741 A | 11/1999 | Koizumi et al. | |
| 7,427,803 B2 * | 9/2008 | Chao et al. | 257/659 |
| 7,605,477 B2 * | 10/2009 | Wong et al. | 257/777 |
| 8,227,902 B2 * | 7/2012 | Kuo | 257/659 |
| 2005/0212071 A1 | 9/2005 | Yue et al. | |
| 2007/0045768 A1 | 3/2007 | Yamanka et al. | |

FOREIGN PATENT DOCUMENTS

| | | |
|---|---|---|
| JP | 03-046335 | 2/1991 |
| JP | 6-163823 | 6/1994 |
| JP | 3159237 | 2/2001 |
| JP | 2004-207267 | 7/2004 |
| JP | 2005-294320 | 10/2005 |
| JP | 2005-303138 | 10/2005 |
| JP | 2007-053149 | 3/2007 |
| JP | 2007-067012 | 3/2007 |
| JP | 2007-531281 | 11/2007 |
| JP | 2008-034676 | 2/2008 |
| WO | WO 98/12750 | 3/1998 |
| WO | WO 2005/059961 A2 | 6/2005 |
| WO | WO 2007/119278 A1 | 10/2007 |

* cited by examiner

Primary Examiner — Jarrett J Stark
Assistant Examiner — Nicholas Tobergte
(74) Attorney, Agent, or Firm — McDermott Will & Emery LLP

(57) ABSTRACT

A digital circuit portion (6) and an analog circuit portion (7) are formed in a surface portion of a semiconductor substrate (4). A via (20) is formed in a region between the digital circuit portion (6) and the analog circuit portion (7). The via (20) extends through the semiconductor substrate (4) from a front surface to a back surface thereof, and is made of a dielectric (2) having its surface covered by a metal (1). The metal (1) is grounded. Signal interference between the analog circuit portion (6) and the digital circuit portion (7) is reduced by the via (20).

18 Claims, 16 Drawing Sheets

SEMICONDUCTOR DEVICE

CROSS-REFERENCE TO RELATED APPLICATION

This is a continuation of PCT International Application PCT/JP2010/004909 filed on Aug. 4, 2010, which claims priority to Japanese Patent Application No. 2010-006503 filed on Jan. 15, 2010. The disclosures of these applications including the specifications, the drawings, and the claims are hereby incorporated by reference in their entirety.

BACKGROUND

The present invention relates to semiconductor devices, and more particularly to semiconductor devices containing both an analog circuit such as an analog radio frequency (RF) circuit and a digital circuit.

In recent years, large-scale systems on chip (SoCs) containing an analog RF circuit have been increasingly implemented in order to reduce the cost and size of radio modules. However, in the SoCs containing an analog RF circuit, noise that is generated by the digital circuit is introduced into the analog RF circuit through a semiconductor substrate, which contributes to performance degradation of the analog RF circuit. In such semiconductor devices, sufficient isolation needs to be provided between a digital circuit portion and an analog RF circuit portion to remove signal interference between blocks as much as possible. Note that this problem can also occur even when an analog circuit other than the analog RF circuit is contained together with the digital circuit.

Related art for such element isolation that has been reported to ensure isolation includes techniques of noise removal by guard rings, trench isolation, increased substrate resistance, etc.

The noise removal by guard rings is described in, e.g., Japanese Patent Publication No. H03-46335. In a semiconductor device of Japanese Patent Publication No. H03-46335, noise is blocked in a blocking region, which is formed by a substrate contact diffusion region provided around a digital circuit as a noise source and metal interconnects connected thereto. Since the metal interconnects are grounded, noise propagating through a substrate can be absorbed by the metal interconnects.

The trench isolation is described in Japanese Patent Publication No. 2007-67012 and Japanese Patent No. 3159237. In semiconductor devices described in Japanese Patent Publication No. 2007-67012 and Japanese Patent No. 3159237, a trench type insulating region is formed to surround a semiconductor element, thereby reducing propagation of signals or noise that is caused by the signals.

Another method is to increase the resistivity of a silicon substrate to form a high resistivity region around a semiconductor element in the substrate, thereby attenuating signals that leak from the semiconductor element and propagate through the substrate, and reducing crosstalk.

SUMMARY

In recent large-scale SoCs, however, since digital circuits have been increased in scale, and noise from the digital circuits has been increased, sufficient isolation cannot be provided by merely using the above methods.

The trench isolation of Japanese Patent Publication No. 2007-67012 and Japanese Patent No. 3159237 increases the cost in the case where semiconductor devices are manufactured by complementary metal oxide semiconductor (CMOS) processes. The method of increasing the substrate resistivity improves isolation, but increases thermal noise that is generated from the substrate. Semiconductor elements formed at the surface of the semiconductor substrate pick up the thermal noise via substrate parasitic capacitance, etc., whereby signals of the semiconductor elements are degraded. Moreover, the high substrate resistivity tends to cause crystal defects, whereby latch-up tends to occur due to a PN junction leakage current, resulting in unstable circuit operation. Another solution is to increase the distance between blocks. However, this increases the chip size.

In view of the above problems, it is an object of the present invention to reduce signal degradation by noise by reducing signal interference between an analog circuit and a digital circuit at low manufacturing cost while stabilizing circuit operation, in a semiconductor device containing both an analog circuit and a digital circuit.

In one aspect of the present invention, a semiconductor device includes: a semiconductor substrate; a digital circuit portion formed in a surface portion of the semiconductor substrate; an analog circuit portion formed in the surface portion of the semiconductor substrate; and at least one via formed in a region between the digital circuit portion and the analog circuit portion. The via extends through the semiconductor substrate from a front surface to a back surface thereof, and is made of a dielectric having its surface covered by a metal. The metal that covers a surface of the via is grounded.

According to this aspect, the low impedance via, which is made of the dielectric having its surface covered by the metal and in which this metal at the surface is grounded, is formed in the region between the digital circuit portion and the analog circuit portion to block a propagation path of noise that is generated in the digital circuit portion, whereby the noise is removed. Thus, isolation from the digital circuit portion to the analog circuit portion is improved.

According to the present invention, satisfactory isolation can be ensured and external noise can be removed without a significant increase in cost. Thus, the problem of isolation in semiconductor devices containing both an analog circuit and a digital circuit, such as SoCs containing an analog RF circuit, can be solved, and the size of the semiconductor devices can be reduced. The present invention can keep the cost down because three dimensional mounting techniques using through vias have already been established in the field of memory stacks, etc., and this structure is applied to enhance isolation. According to the present invention, isolation can be enhanced without increasing the substrate resistance, whereby malfunctions of circuits due to latch-up can also be reduced. Note that these advantages are not limited by the frequency bands and the devices and systems that are used.

BRIEF DESCRIPTION OF THE DRAWINGS

FIG. 1A is a plan view, and FIG. 1B is a cross-sectional view.

FIG. 2A is a plan view, and FIG. 2B is a cross-sectional view.

FIG. 5A is a plan view, and FIG. 5B is a cross-sectional view.

FIG. 8A is a plan view, and FIG. 8B is a cross-sectional view.

FIG. 9A is a plan view, and FIG. 9B is a cross-sectional view.

FIG. 10A is a plan view, and FIG. 10B is a cross-sectional view.

FIG. 11A is a plan view, and FIG. 11B is a cross-sectional view.

FIG. 15A is a plan view, and FIG. 15B is a cross-sectional view.

DETAILED DESCRIPTION

Semiconductor devices according to embodiments of the present invention will be described below with reference to the accompanying drawings.

First Embodiment

Figure 1A:
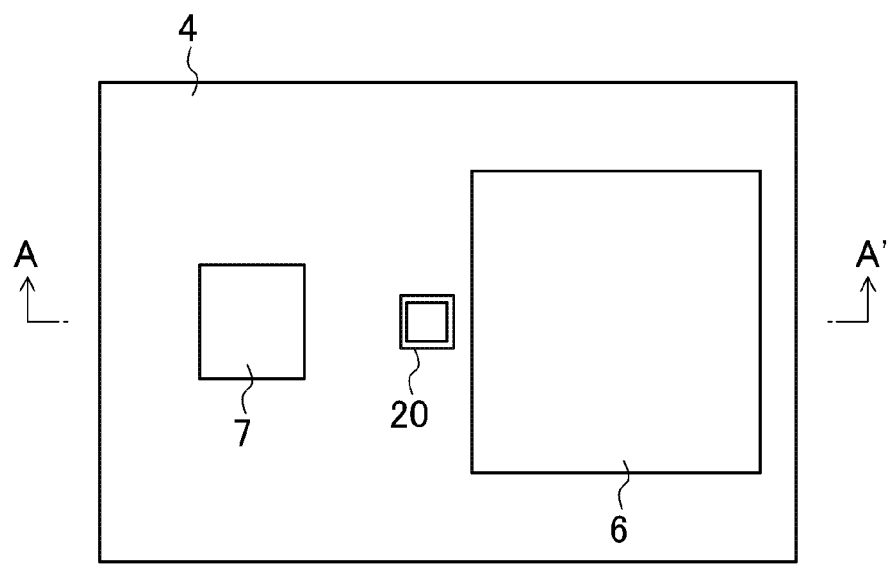
FIGS. 1A-1B are diagrams showing a configuration of a semiconductor device of a first embodiment, where
Figure 1B:
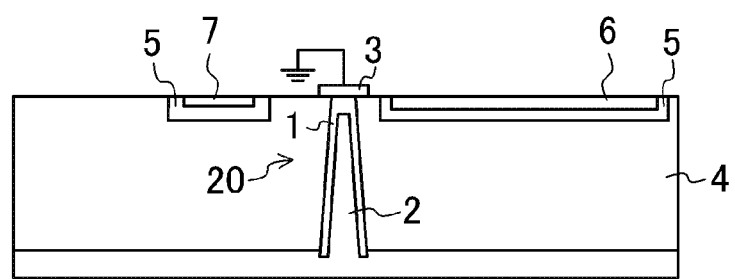

FIGS. 1A-1B are diagrams showing a configuration of a semiconductor device of a first embodiment, where FIG. 1A is a plan view, and FIG. 1B is a cross-sectional view taken along line A-A' in FIG. 1A. In the semiconductor device of FIGS. 1A-1B, a first layer 5 is formed in the front side of a semiconductor substrate 4 such as a silicon semiconductor substrate, and a digital circuit portion 6 and an analog RF circuit portion 7 as an analog circuit portion are formed in the first layer 5, namely a surface portion of the semiconductor substrate 4. A via 20 is formed in a region between the analog RF circuit portion 7 and the digital circuit portion 6 in the surface of the semiconductor substrate 4. Either one via 20 or a plurality of vias 20 may be provided.

The via 20 extends through the semiconductor substrate 4 from the front surface to the back surface thereof. The surface of the via 20 is covered by a metal 1, and the inside of the via 20 is formed by a dielectric 2. The metal 1 that covers the surface of the via 20 is grounded via, e.g., a semiconductor inner interconnect layer 3.

Signal-induced noise is generated by operation of the digital circuit portion 6, and the generated noise propagates in the lateral and depth directions via the semiconductor substrate 4 having a conductive property. In the semiconductor device of FIGS. 1A-1B, however, since the grounded through via 20 is positioned on a path from the digital circuit portion 6 to the analog RF circuit portion 7, the noise is absorbed by the metal 1 of the through via 20, whereby propagation of the noise to the analog RF circuit portion 7 is reduced. That is, according to the present embodiment, the noise generated in the digital circuit portion 6 is removed by the ground of the low impedance via 20, whereby isolation between the digital circuit portion 6 and the analog RF circuit portion 7 is improved.

Figure 2A:
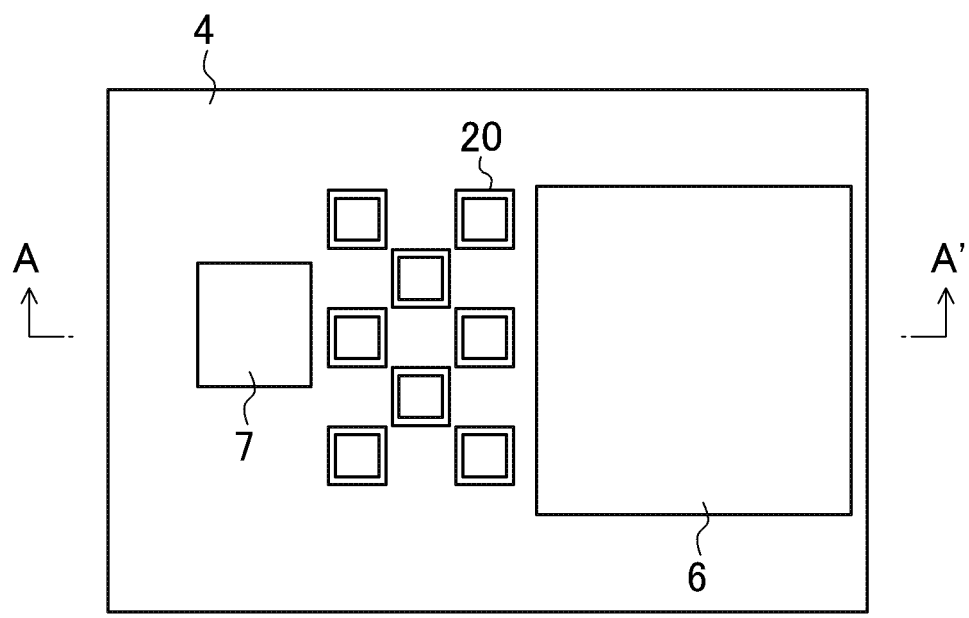
FIGS. 2A-2B are diagrams showing another configuration of the semiconductor device of the first embodiment, where
Figure 2B:
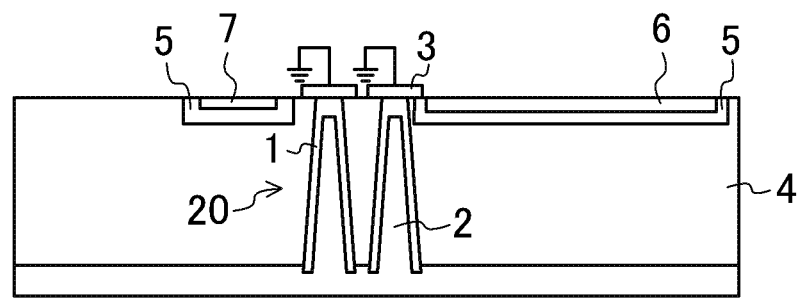

FIGS. 2A-2B are diagrams showing another configuration of the semiconductor device of the present embodiment, where FIG. 2A is a plan view, and FIG. 2B is a cross-sectional view taken along line A-A' in FIG. 2A. The configuration of FIGS. 2A-2B is basically similar to that of FIGS. 1A-1B except that a plurality of vias 20 are arranged in a checkered pattern as viewed from the front side of the semiconductor substrate 4, in the region between the analog RF circuit portion 7 and the digital circuit portion 6.

Arranging the plurality of vias 20 in this manner further blocks the path from the digital circuit portion 6 to the analog RF circuit portion 7, whereby introduction of noise to the analog RF circuit portion 7 can further be reduced. Thus, more satisfactory isolation can be ensured.

Figure 3:
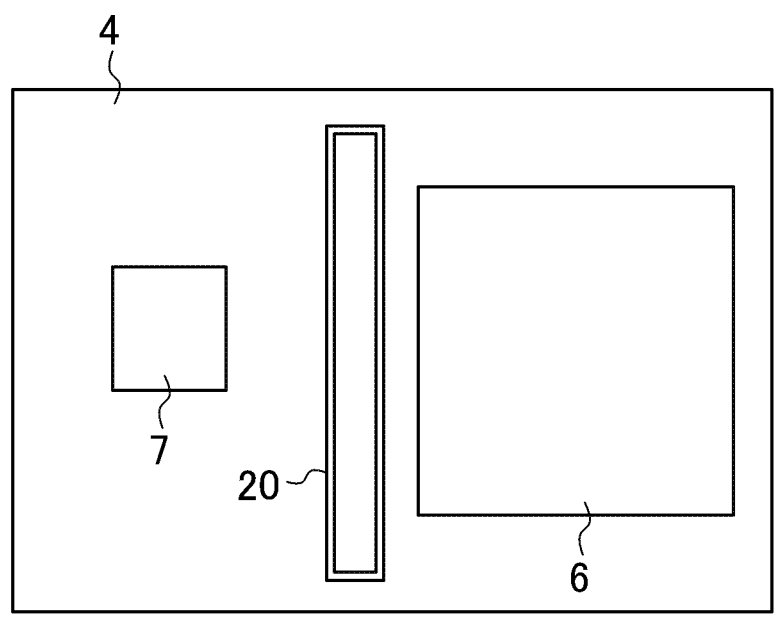
FIG. 3 is a plan view showing still another configuration of the semiconductor device of the first embodiment.

FIG. 3 is a plan view showing still another configuration of the semiconductor device of the present embodiment. In the configuration of FIG. 3, the via 20 is formed to be longer in the vertical direction than in the lateral direction, and is positioned to isolate the digital circuit portion 6 from the analog RF circuit portion 7. That is, the via 20 is formed to have a greater dimension in the vertical direction (a second direction perpendicular to a first direction) than in the lateral direction (the first direction from the digital circuit portion 6 to the analog RF circuit portion 7) at the front surface of the semiconductor substrate 4.

Positioning the via 20 in this manner can further block the path through which noise is introduced from the digital circuit portion 6 to the analog RF circuit portion 7, whereby satisfactory isolation can be ensured. In this case, it is preferable that the vertical dimension of the via 20 be greater than that of the digital circuit portion 6.

Figure 22:
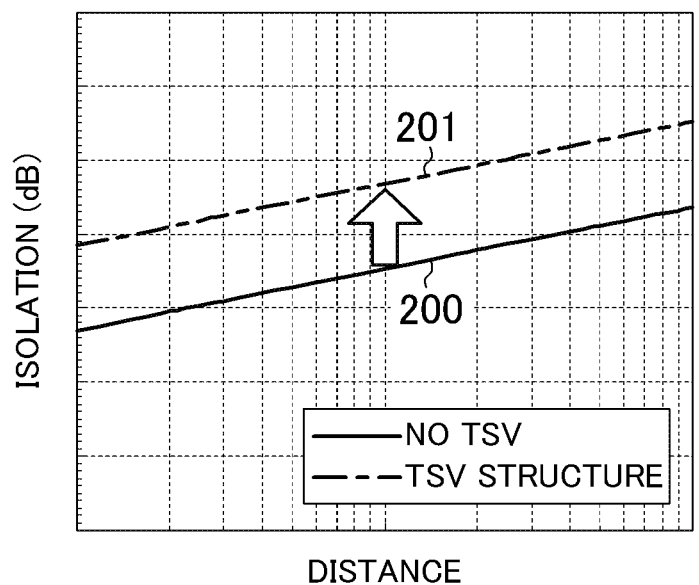
FIG. 22 is a graph showing the effect of improving isolation according to an embodiment.

FIG. 22 is a graph showing the simulation result of isolation in the case where the via 20 has an aspect ratio of 10:1. The X-axis represents the distance between the circuits, and the Y-axis represents isolation. Characteristics are as shown by curve 200 when nothing is placed between the circuits. When the via 20 is positioned as shown in FIG. 3, characteristics are as shown by curve 201, and isolation is improved by about 20 dB.

Figure 4A:
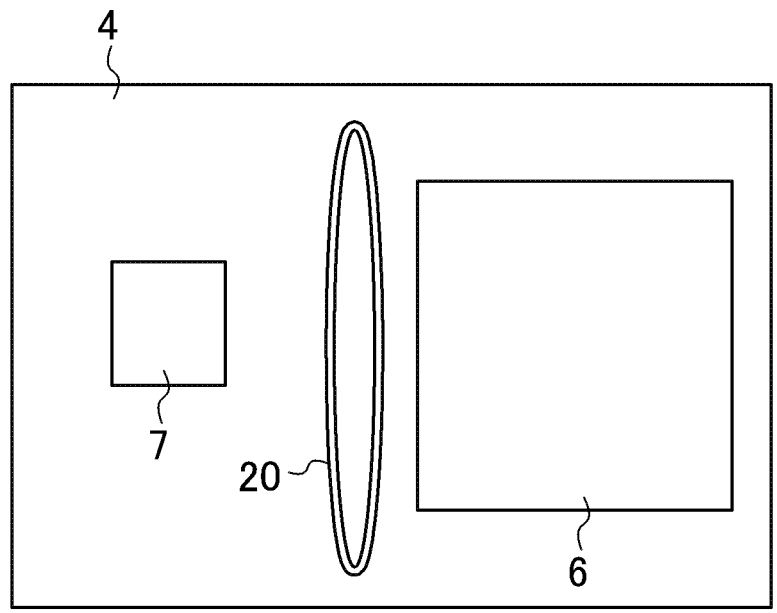
FIGS. 4A-4B are plan views showing further configurations of the semiconductor device of the first embodiment.
Figure 4B:
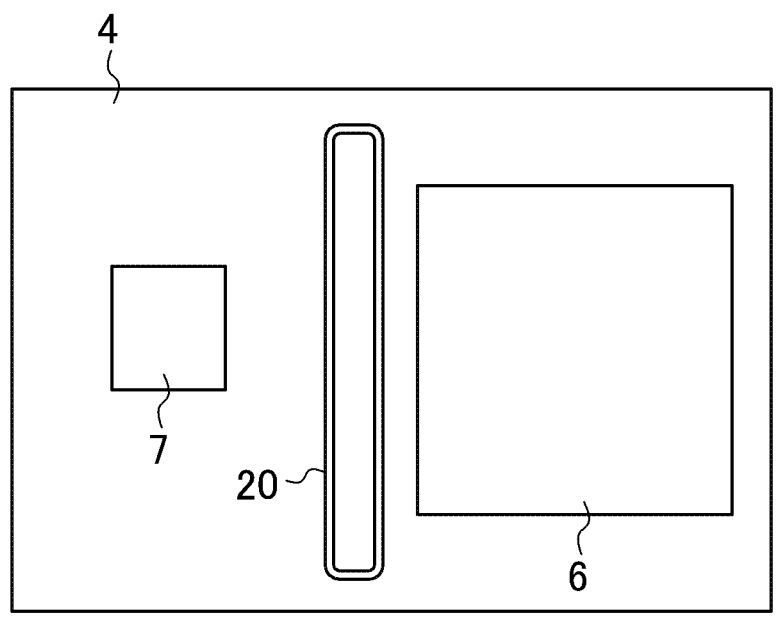

FIGS. 4A-4B are plan views showing further configurations of the semiconductor device of the present embodiment. In the configuration of FIG. 4A, the via 20 is formed to be longer in the vertical direction than in the lateral direction as in FIG. 3. The via 20 is formed in an elliptical shape in FIG. 4A. Alternatively, as in the configuration of FIG. 4B, the through via 20 that is longer in the vertical direction than in the lateral direction may have four rounded corners. That is, the via 20 is formed in a rectangular shape having four rounded corners. Rounding the corners can reduce stress that is applied upon manufacturing, thereby reducing the level of manufacturing difficulty, and facilitating formation of the through via 20.

Second Embodiment

Figure 5A:
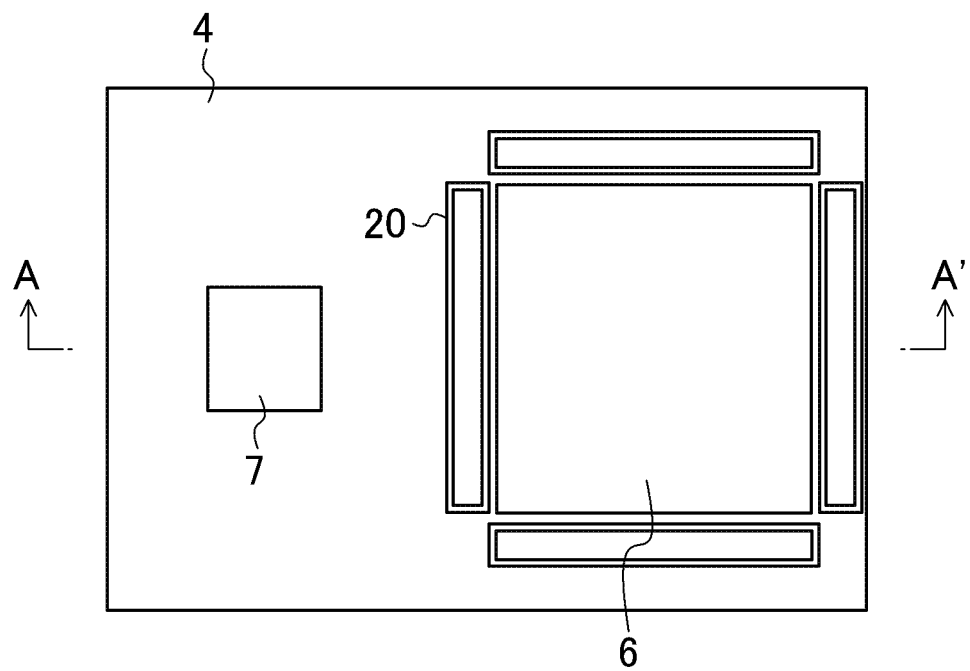
FIGS. 5A-5B are diagrams showing a configuration of a semiconductor device of a second embodiment, where
Figure 5B:
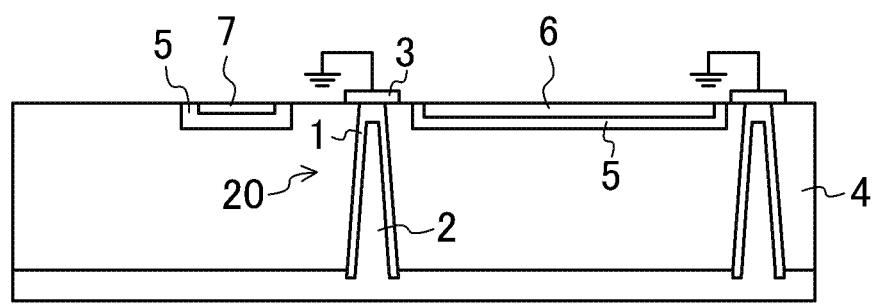

FIGS. 5A-5B are diagrams showing a configuration of a semiconductor device of a second embodiment, where FIG. 5A is a plan view, and FIG. 5B is a cross-sectional view taken along line A-A' in FIG. 5A. In the configuration of FIGS. 5A-5B, a plurality of vias 20 are formed to surround the digital circuit portion 6. With such a configuration, signal leakage from the digital circuit portion 6 is absorbed by the grounded portions of the vias 20 surrounding the digital circuit portion 6. That is, introduction of noise from the digital circuit portion 6 to the analog RF circuit portion 7 can further be reduced.

Figure 6:
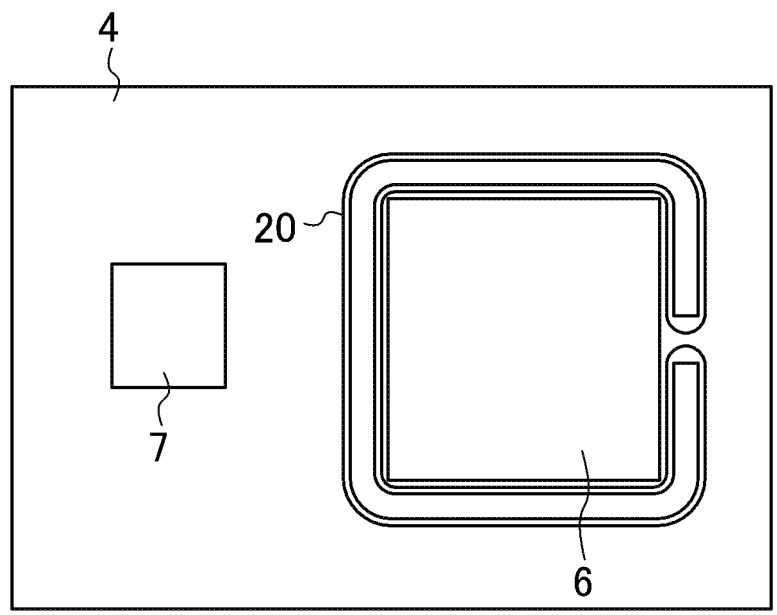
FIG. 6 is a plan view showing another configuration of the semiconductor device of the second embodiment.

Alternatively, as in a configuration of FIG. 6, a single via 20 may be formed in a "C" or "U" shape. In the configuration of FIG. 6, the via 20 having at least one gap formed therein continuously surrounds the digital circuit portion 6. This can further enhance isolation.

Figure 7:
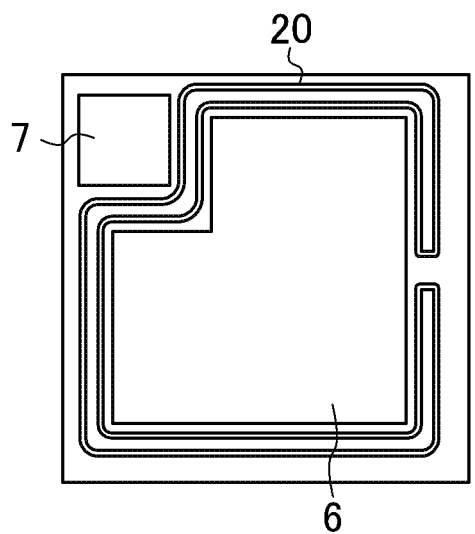
FIG. 7 is a plan view showing still another configuration of the semiconductor device of the second embodiment.

FIG. 7 shows a configuration in the case where the circuit scale of the digital circuit portion 6 is increased. The analog RF circuit portion 7 is placed in the upper left corner, and the digital circuit portion 6 is placed in the remaining region. In the configuration of FIG. 7 as well, the via 20 is formed to surround the digital circuit portion 6.

Note that although at least one via 20 is formed to surround the digital circuit portion 6 in the configurations of FIGS. 5A-7, the via may be formed to surround the analog RF circuit portion. This can reduce interference of noise introduced from the digital circuit portion. Alternatively, the vias may be formed around both the digital circuit portion and the analog RF circuit portion, respectively. In this case, isolation can further be enhanced by separating the ground points of the vias from each other on the semiconductor substrate.

Figure 8A:
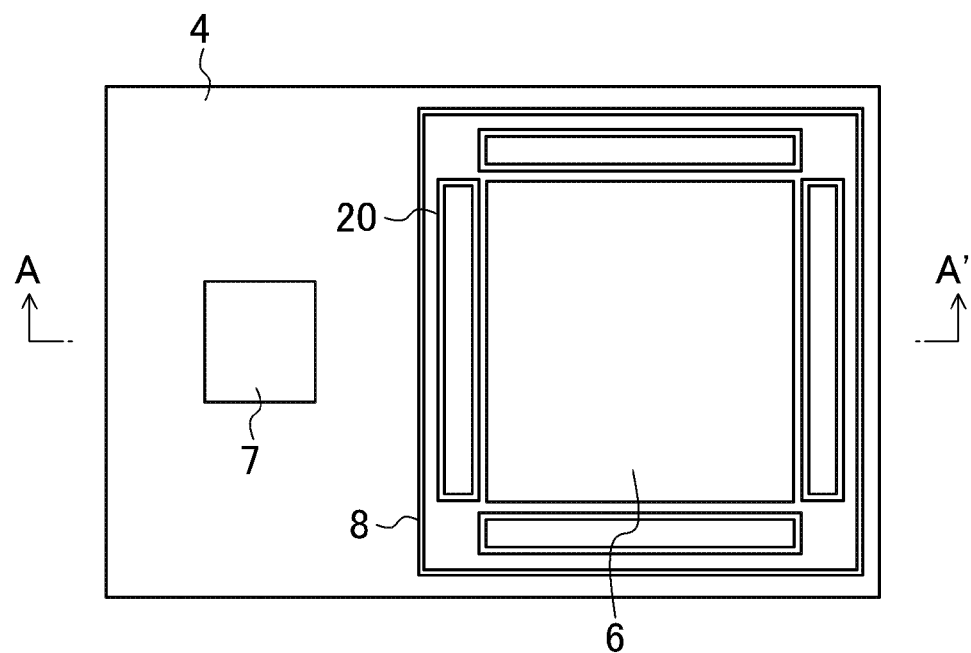
FIGS. 8A-8B are diagrams showing a further configuration of the semiconductor device of the second embodiment, where
Figure 8B:
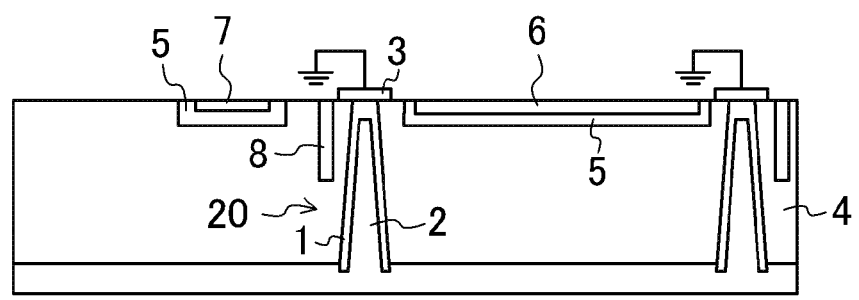

FIGS. 8A-8B are diagrams showing another configuration of the semiconductor device of the present embodiment, where FIG. 8A is a plan view, and FIG. 8B is a cross-sectional view taken along line A-A' in FIG. 8A. The configuration of FIGS. 8A-8B is substantially similar to that of FIGS. 5A-5B, and the vias 20 are formed to surround the digital circuit portion 6. A trench type insulating region 8 is further formed outside the vias 20 so as to surround the digital circuit portion 6.

Figure 9A:
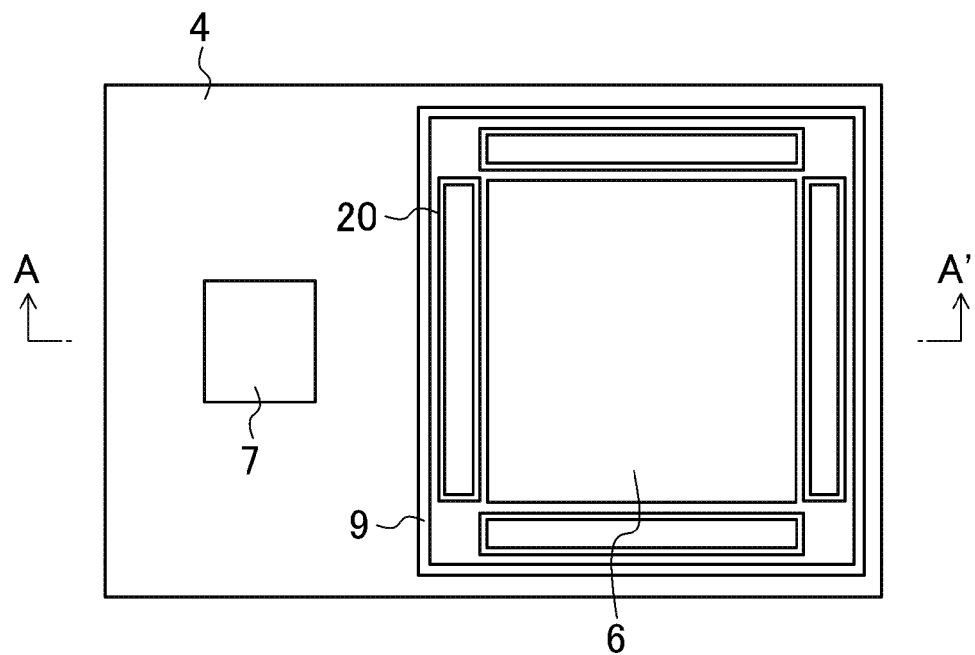
FIGS. 9A-9B are diagrams showing a still further configuration of the semiconductor device of the second embodiment, where
Figure 9B:
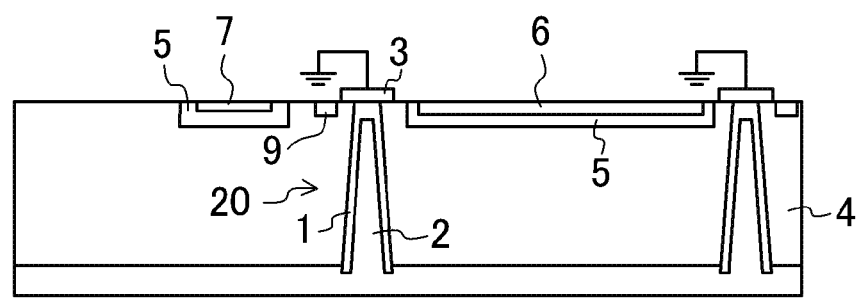

FIGS. 9A-9B are diagrams showing still another configuration of the semiconductor device of the present embodiment, where FIG. 9A is a plan view, and FIG. 9B is a cross-sectional view taken along line A-A' in FIG. 9A. The configuration of FIGS. 9A-9B is also substantially similar to that of FIGS. 5A-5B, and the vias 20 are formed to surround the digital circuit portion 6. A guard ring 9, which is formed by grounding a silicon active layer by a contact, is further formed outside the vias 20 so as to surround the digital circuit portion 6.

Thus, providing the trench type insulating region 8 or the guard ring 9 in addition to the vias 20 can further reduce introduction of noise from the digital circuit portion 6 to the analog RF circuit portion 7.

Figure 10A:
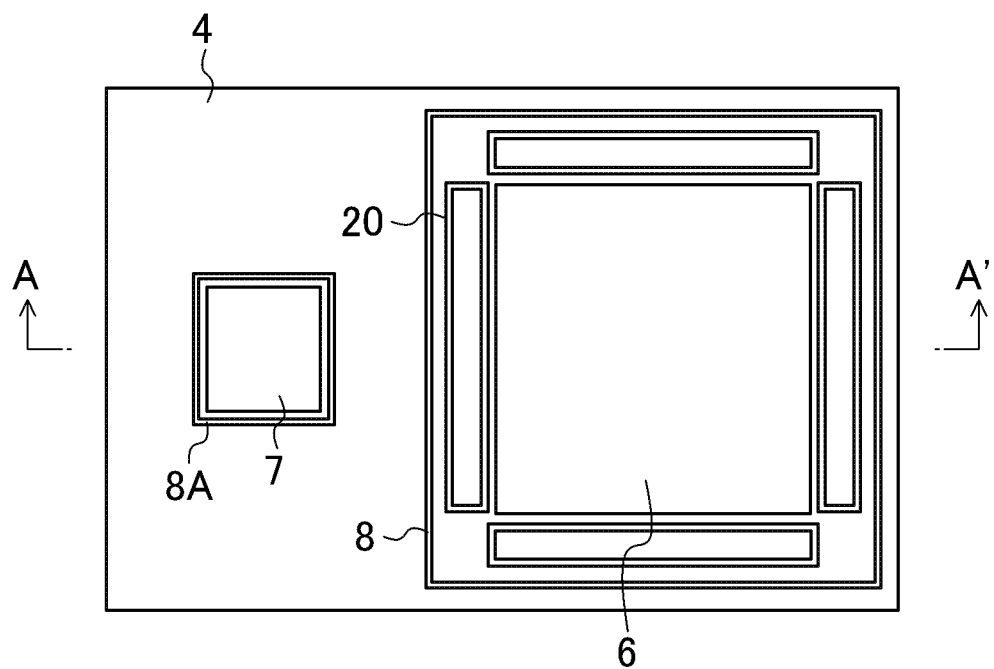
FIGS. 10A-10B are diagrams showing a yet further configuration of the semiconductor device of the second embodiment, where
Figure 10B:
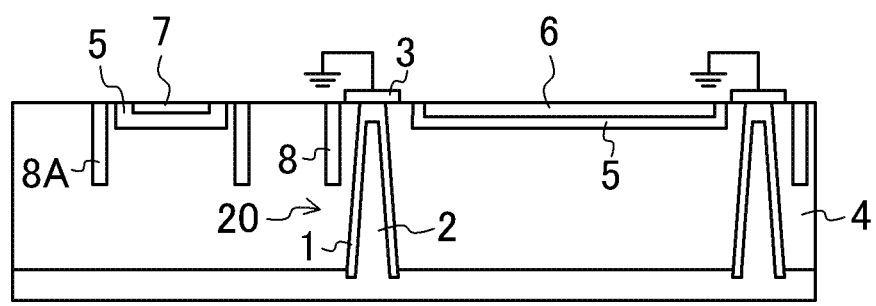

As shown in FIGS. 10A-10B, a trench type insulating region 8A may further be formed to surround the analog RF circuit portion 7, in addition to the trench type insulating region 8 surrounding the digital circuit portion 6. Note that the trench type insulating film 8 may be omitted in the configuration of FIGS. 10A-10B.

Figure 11A:
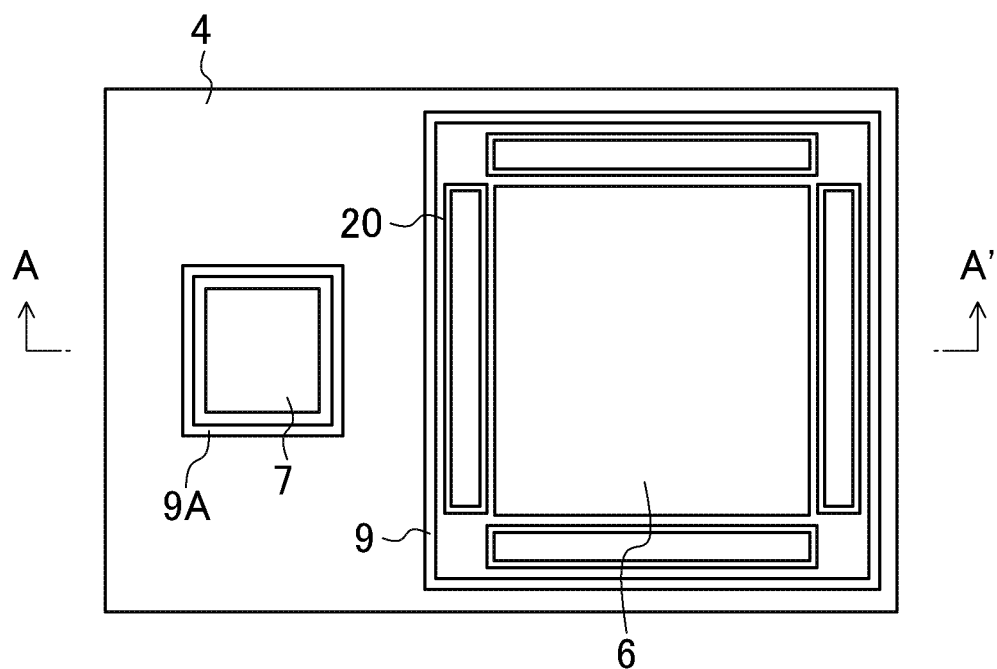
FIGS. 11A-11B are diagrams showing a yet further configuration of the semiconductor device of the second embodiment, where
Figure 11B:
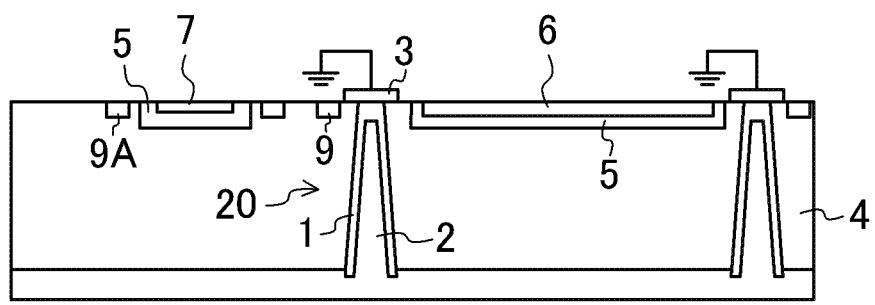

Moreover, as shown in FIGS. 11A-11B, a guard ring 9A may further be formed to surround the analog RF circuit portion 7, in addition to the guard ring 9 surrounding the digital circuit portion 6. Note that the guard ring 9 may be omitted in the configuration of FIGS. 11A-11B.

Third Embodiment

Figure 12:
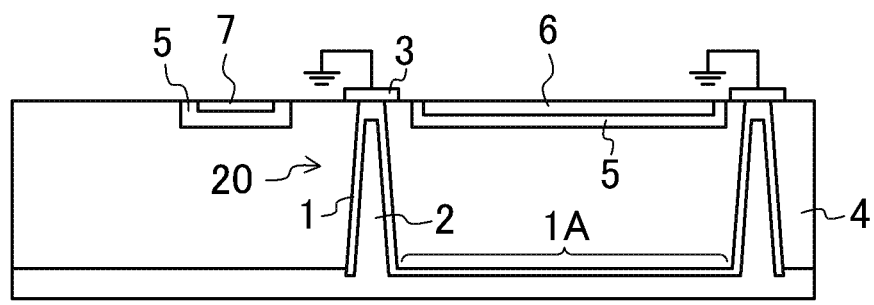
FIG. 12 is a cross-sectional view showing a configuration of a semiconductor device of a third embodiment.

FIG. 12 is a cross-sectional view showing a configuration of a semiconductor device of a third embodiment, and corresponds to the plan view of FIG. 5A. In the configuration of FIG. 12, the metal 1 of the vias 20 is extended in a planar fashion in a region 1A corresponding to the digital circuit portion 6 in the back surface of the semiconductor substrate 4. With this configuration, external noise can also be absorbed at the back surface of the substrate below the circuits, whereby isolation is improved.

Note that the metal 1 may be formed in a mesh pattern in the region 1A. The metal 1 may be extended in a region corresponding to the analog RF circuit portion 7 on the back side of the semiconductor substrate 4.

Fourth Embodiment

Figure 13:
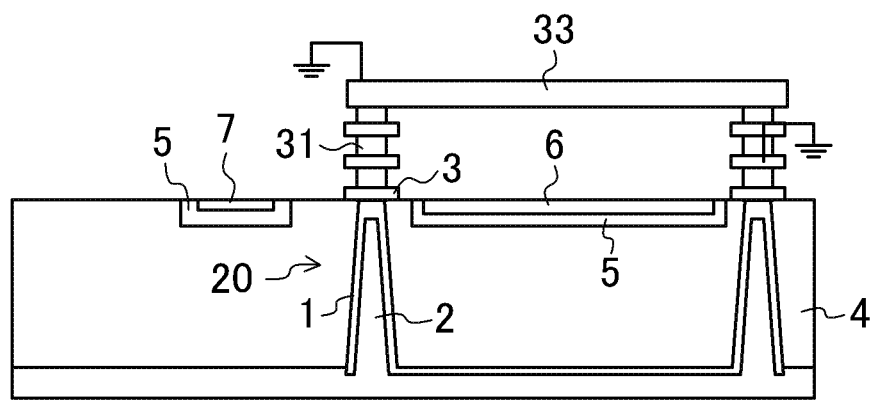
FIG. 13 is a cross-sectional view showing a configuration of a semiconductor device of a fourth embodiment.

FIG. 13 is a cross-sectional view showing a configuration of a semiconductor device of a fourth embodiment of the present invention, and corresponds to the plan view of FIG. 5A. In the configuration of FIG. 13, the metal 1 of the vias 20 is connected to a grounded redistribution layer 33, formed over the semiconductor substrate 4, via a semiconductor inner interconnect layer 3 and a via 31 on the front side of the semiconductor substrate 4. This redistribution layer 33 is formed in a planar fashion or in a mesh pattern so as to cover the digital circuit portion 6 as viewed from the front side of the semiconductor substrate 4. Covering the digital circuit portion 6 by the redistribution layer 33 such as in a wafer level chip size package (CSP), etc. can further reduce ground (GND) impedance, whereby digital noise propagation can be reduced.

Note that a similar advantage can be obtained by covering the digital circuit portion at the substrate surface in a planar fashion by using an inner interconnect layer and an inner via.

Fifth Embodiment

Figure 14:
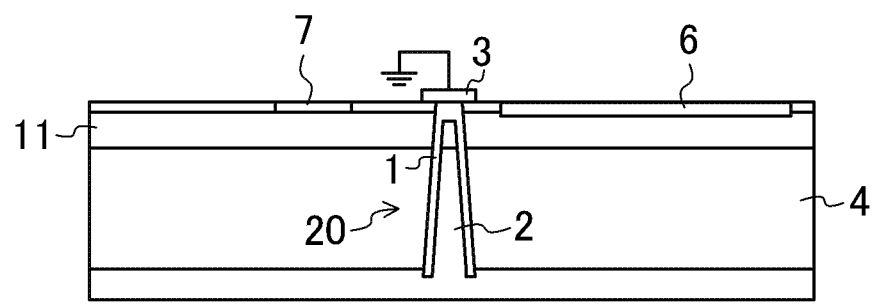
FIG. 14 is a cross-sectional view showing a configuration of a semiconductor device of a fifth embodiment.

FIG. 14 is a cross-sectional view showing a configuration of a semiconductor device according to a fifth embodiment, and corresponds to the plan view of FIG. 1A. In the configuration of FIG. 14, an insulating or high resistance layer 11 is formed in the front side of the semiconductor substrate 4, and the digital circuit portion 6 and the analog RF circuit portion 7 are formed on the insulating or high resistance layer 11. In other words, the insulating or high resistance layer 11 is formed on the back side of the digital circuit portion 6 and the analog RF circuit portion 7. In the case of forming the insulating layer, the semiconductor device has a structure like silicon on insulator (SOI). The high resistance layer can be implemented by increasing the resistance by implantation of protons.

Such a structure increases impedance between the semiconductor substrate 4, and the digital circuit portion 6 and the analog RF circuit portion 7, whereby isolation is improved.

Sixth Embodiment

Figure 15A:
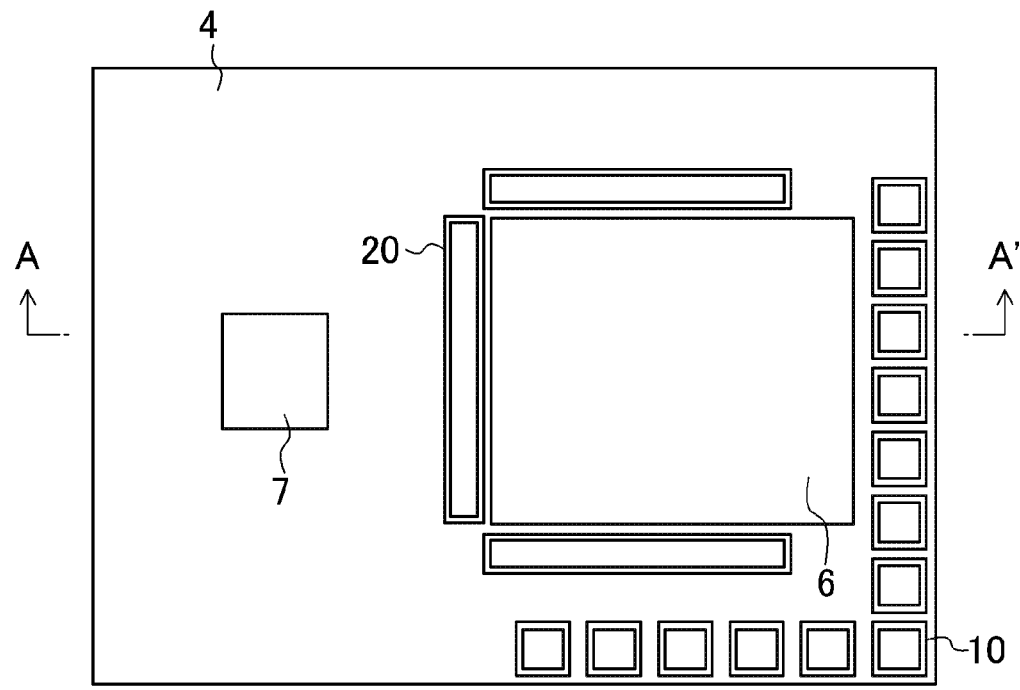
FIGS. 15A-15B are diagrams showing a configuration of a semiconductor device of a sixth embodiment, where
Figure 15B:
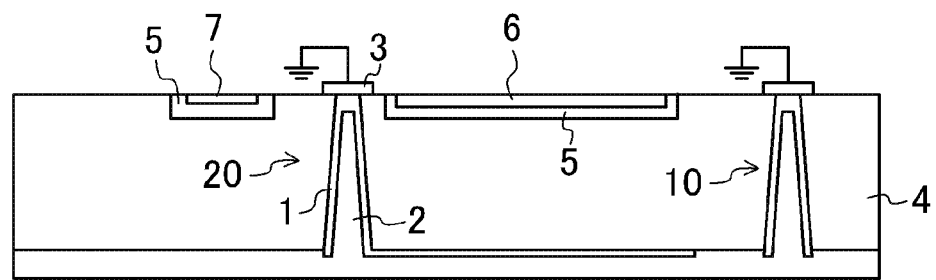

FIGS. 15A-15B are diagrams showing a configuration of a semiconductor device of a sixth embodiment, where FIG.

15A is a plan view, and FIG. 15B is a cross-sectional view taken along line A-A' in FIG. 15A. In the configuration of FIGS. 15A-15B, second vias 10 functioning as input/output terminals of the digital circuit portion 6 are formed in addition to the vias 20 formed around the digital circuit portion 6 to enhance isolation. Like the vias 20, the second vias 10 extend through the semiconductor substrate 4 from the front surface to the back surface thereof, and are made of a dielectric having its surface covered by a metal. In this manner, both the through vias 20 for enhancing isolation and the through vias 10 for inputting/outputting signals can be implemented in the same semiconductor substrate 4.

Seventh Embodiment

Figure 16:
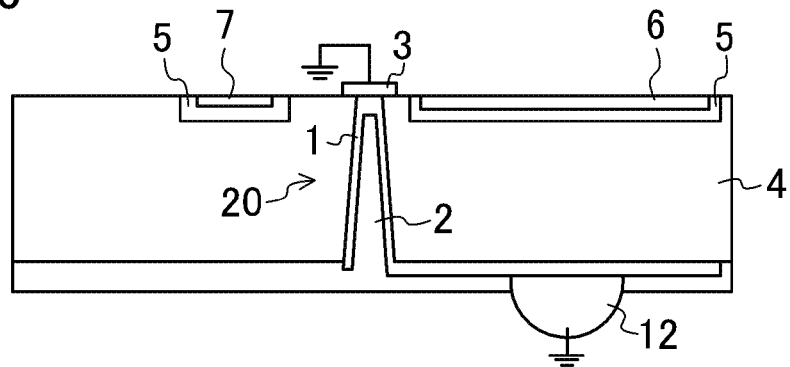
FIG. 16 is a cross-sectional view showing a configuration of a semiconductor device of a seventh embodiment.
Figure 17:
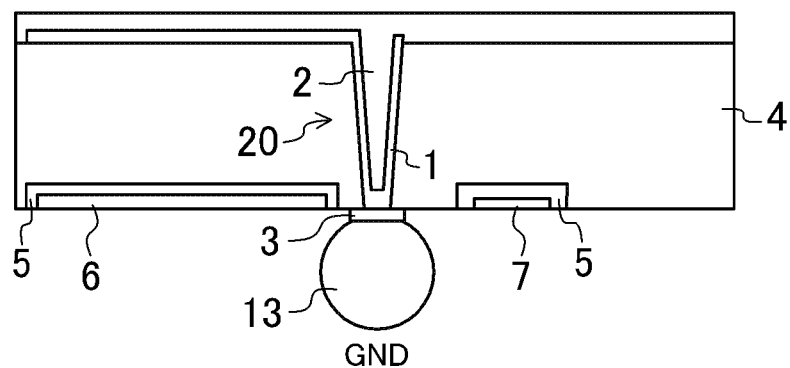
FIG. 17 is a cross-sectional view showing another configuration of the semiconductor device of the seventh embodiment.
Figure 18:
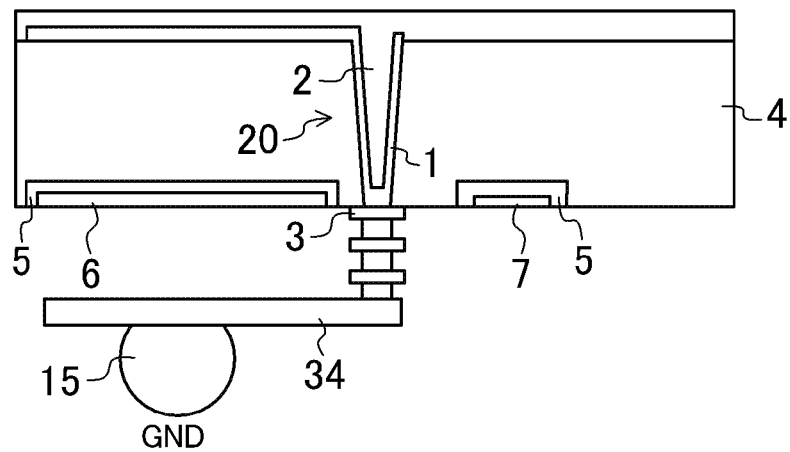
FIG. 18 is a cross-sectional view showing still another configuration of the semiconductor device of the seventh embodiment.

FIGS. 16-18 are cross-sectional views showing configurations of a semiconductor device of a seventh embodiment, and correspond to the plan view of FIG. 1A. Note that the configuration of the semiconductor device is shown upside down in FIGS. 17-18. In the configuration of FIG. 16, the metal 1 that covers the via 20 is connected to a grounded bump (a solder ball) 12 at the back surface of the semiconductor substrate 4. In the configuration of FIG. 17, the metal 1 that covers the via 20 is connected to a grounded bump 13 at the front surface of the semiconductor substrate 4. In the configuration of FIG. 18, the metal 1 that covers the via 20 is connected to a redistribution layer 34 at the front surface of the semiconductor substrate 4, and this redistribution layer 34 is connected to a grounded bump 15.

As in these configurations, connecting the metal 1 of the via 20 to the grounded bump can implement a lower impedance grounding effect, whereby isolation is improved.

Figure 19:
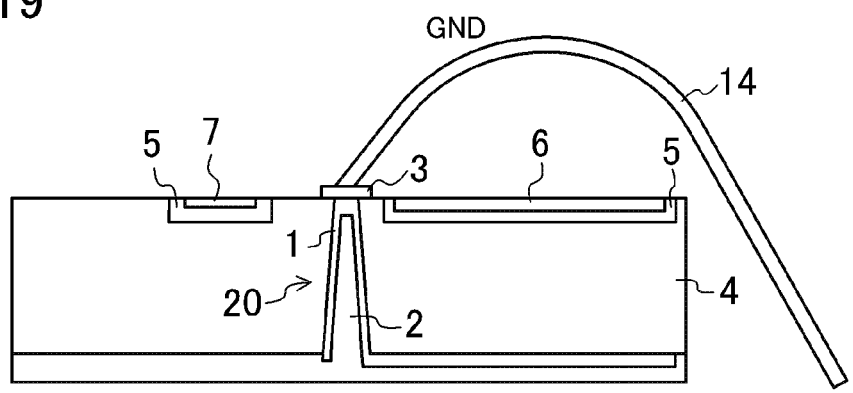
FIG. 19 is a cross-sectional view showing a further configuration of the semiconductor device of the seventh embodiment.

FIG. 19 is a cross-sectional view showing another configuration of the semiconductor device of the present embodiment, and corresponds to the plan view of FIG. 1A. In the configuration of FIG. 19, the metal 1 that covers the via 20 is connected to a grounded wire 14 at the front surface of the semiconductor substrate 4. With this configuration, the grounding effect can be implemented, and isolation is improved.

Figure 20:
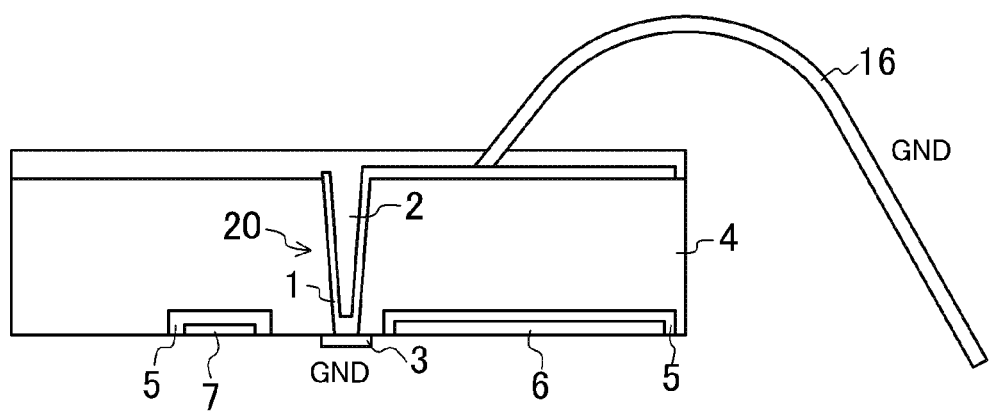
FIG. 20 is a cross-sectional view showing a still further configuration of the semiconductor device of the seventh embodiment.

FIG. 20 is a cross-sectional view showing still another configuration of the semiconductor device of the present embodiment, and corresponds to the plan view of FIG. 1A. In the configuration of FIG. 20, the metal 1 that covers the via 20 is connected to a grounded wire 16 at the back surface of the semiconductor substrate 4. With this configuration, the grounding effect can be implemented, and isolation is improved. Moreover, the distance to a die pad of a package can be secured even if an inductor is formed by redistribution.

Figure 21:
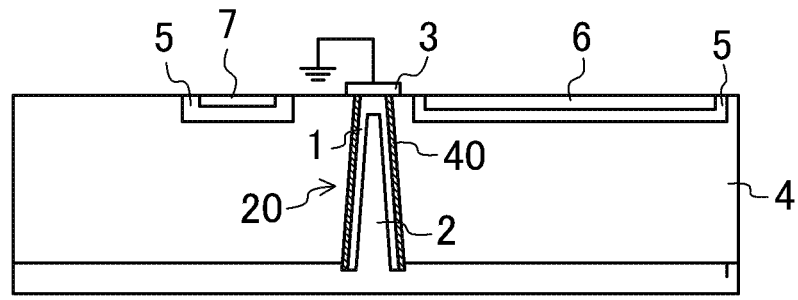
FIG. 21 is a cross-sectional view showing a configuration of a semiconductor device of an embodiment using another via structure.

Note that in the above embodiments, a configuration in which an insulating film is provided between the metal that covers the via surface and the semiconductor substrate may be used for the via structure. FIG. 21 is a cross-sectional view showing a configuration in which such a via structure is applied to the first embodiment, and corresponds to the plan view of FIG. 1A. In the configuration of FIG. 21, the via 20 extends through the semiconductor substrate 4 from the front surface to the back surface thereof, the surface of the via 20 is covered by the metal 1, and an insulating film 40 is provided between the metal 1 and the semiconductor substrate 4. The inside of the via 20 is made of the dielectric 2. The metal 1 that covers the surface of the via 20 is grounded via, e.g., the semiconductor inner interconnect layer 3. Such a via structure as shown in FIG. 21 may be applied to the other embodiments.

Note that the components of two or more of the embodiments may be arbitrarily combined without departing from the principles of the invention.

In the present invention, isolation between the digital circuit portion and the analog circuit portion can be enhanced at low cost. Thus, the present invention is useful for improving performance and reducing cost in, e.g., large-scale SoCs containing an analog RF circuit.

What is claimed is:

1. A semiconductor device, comprising:
a semiconductor substrate;
a digital circuit portion formed in a surface portion of the semiconductor substrate;
an analog circuit portion formed in the surface portion of the semiconductor substrate; and
at least one via formed in a region between the digital circuit portion and the analog circuit portion, wherein
the via extends through the semiconductor substrate from a front surface to a back surface thereof, and is made of a dielectric having its surface covered by a metal, and
the metal that covers a surface of the via is grounded.

2. The semiconductor device of claim 1, wherein
multiple ones of the via are arranged in a checkered pattern.

3. The semiconductor device of claim 1, wherein
the via is formed to have a greater dimension in a second direction perpendicular to a first direction than in the first direction from the digital circuit portion toward the analog circuit portion, at the front surface of the semiconductor substrate.

4. The semiconductor device of claim 3, wherein
the dimension of the via in the second direction is greater than a dimension of the digital circuit portion in the second direction.

5. The semiconductor device of claim 3, wherein
the via is formed in an elliptical shape or in a rectangular shape having four rounded corners.

6. The semiconductor device of claim 1, wherein
the via is formed to surround at least one of the digital circuit portion and the analog circuit portion.

7. The semiconductor device of claim 1, wherein
a trench type insulating region is formed to surround at least one of the digital circuit portion and the analog circuit portion.

8. The semiconductor device of claim 1, wherein
a guard ring of an active silicon layer is formed to surround at least one of the digital circuit portion and the analog circuit portion.

9. The semiconductor device of claim 1, wherein
the metal that covers the surface of the via is extended to at least one of a region corresponding to the digital circuit portion and a region corresponding to the analog circuit portion in the back surface of the semiconductor substrate.

10. The semiconductor device of claim 1, wherein
the metal that covers the surface of the via is connected to a grounded redistribution layer over the semiconductor substrate, and
the redistribution layer is formed to cover at least one of the digital circuit portion and the analog circuit portion as viewed from a front side of the semiconductor substrate.

11. The semiconductor device of claim 1, wherein
an insulating layer or a high resistance layer is formed on a back side of the digital circuit portion and the analog circuit portion.

12. The semiconductor device of claim 1, further comprising:

a second via functioning as an input/output terminal of the digital circuit portion or the analog circuit portion, extending through the semiconductor substrate from the front surface to the back surface thereof, and being made of a dielectric having its surface covered by a metal.

13. The semiconductor device of claim 1, wherein
the metal that covers the surface of the via is connected to a grounded bump at the back surface of the semiconductor substrate.

14. The semiconductor device of claim 1, wherein
the metal that covers the surface of the via is connected to a grounded bump at the front surface of the semiconductor substrate.

15. The semiconductor device of claim 1, wherein
the metal that covers the surface of the via is connected to a redistribution layer over the semiconductor substrate, and
the redistribution layer is connected to a grounded bump.

16. The semiconductor device of claim 1, wherein
the metal that covers the surface of the via is connected to a grounded wire at the front surface of the semiconductor substrate.

17. The semiconductor device of claim 1, wherein
the metal that covers the surface of the via is connected to a grounded wire at the back surface of the semiconductor substrate.

18. The semiconductor device of claim 1, wherein
an insulating film is provided between the metal that covers the surface of the via and the semiconductor substrate.

* * * * *